(12) United States Patent
Liu et al.

(10) Patent No.: US 6,510,055 B1
(45) Date of Patent: Jan. 21, 2003

(54) BACKPLANE AND SHELF ARRANGEMENT WITH FRONT ACCESS FEATURES

(75) Inventors: Kan S. Liu, New York, NY (US); Albert Pedoeem, Orange, NY (US)

(73) Assignee: Fujitsu Network Communications, Inc., Richardson, TX (US)

( * ) Notice: Subject to any disclaimer, the term of this patent is extended or adjusted under 35 U.S.C. 154(b) by 58 days.

(21) Appl. No.: 09/692,094

(22) Filed: Oct. 19, 2000

(51) Int. Cl.$^7$ ................................................. H05K 5/02
(52) U.S. Cl. ..................... 361/724; 361/802; 612/223.2; 439/928.1
(58) Field of Search ................................. 361/724, 725, 361/726, 802; 312/223.2, 223.1; 248/201; 385/134, 135, 137; 439/928.1

(56) References Cited

U.S. PATENT DOCUMENTS

| | | | |
|---|---|---|---|
| 6,217,228 B1 | * 4/2001 | Samela et al. | 385/59 |
| 6,300,847 B1 | * 10/2001 | Gallagher et al. | 333/33 |
| 6,362,976 B1 | * 3/2002 | Winters et al. | 361/814 |

* cited by examiner

Primary Examiner—Darren Schuberg
Assistant Examiner—Hung Van Duong
(74) Attorney, Agent, or Firm—Weingarten, Schurgin, Gagnebin & Lebovici LLP

(57) ABSTRACT

An electronic chassis providing front access for printed circuit board insertion and removal and for cable connectors. The electronic chassis includes a backplane assembly and a shelf assembly. The backplane assembly includes a motherboard having a first plurality of connectors for receiving respective daughter cards and/or modules and a second plurality of connectors for receiving signal and/or power cables. Both the first and second pluralities of connectors are mounted on the same side of the motherboard. The shelf assembly includes a housing with opposing sidewalls, a top cover, a bottom support section, and a front cover. The backplane assembly is coupled to the shelf assembly such that the first plurality of connectors is disposed in the housing of the shelf assembly opposite the front cover, and the second plurality of connectors is external to the shelf housing.

8 Claims, 5 Drawing Sheets

BACKPLANE AND SHELF ARRANGEMENT WITH FRONT ACCESS FEATURES

CROSS REFERENCE TO RELATED APPLICATIONS

N/A

STATEMENT REGARDING FEDERALLY SPONSORED RESEARCH OR DEVELOPMENT

N/A

BACKGROUND OF THE INVENTION

The present invention relates generally to chassis for electronic devices, and more specifically to a backplane assembly and shelf arrangement that provides access to devices such as printed circuit cards, modules, and cables connected thereto from one side of the arrangement.

Backplane assembly and shelf arrangements are known which include a backplane assembly coupled to a shelf. The backplane assembly typically includes a printed circuit board ("motherboard") having a plurality of connectors into which other printed circuit boards ("daughter cards"), modules, and/or signal and power cables can be plugged in. The shelf is typically an enclosure with a plurality of slots defined therein for supporting respective daughter cards and/or modules and aligning them with corresponding connectors mounted to the motherboard.

Backplane assembly and shelf arrangements are commonly used in administration systems of optical fiber networks. For example, such an optical fiber administration system may be used at a central office of an optical fiber network and may include a plurality of optical fiber multi-service access frames that receive a portion of the optical fiber cables in the network and provide interfaces for connecting to various types of ports on the network. Such interfaces may include interfaces that are part of a Synchronous Optical NETwork ("SONET network") and/or interfaces for handling telephony and data traffic. Each multi-service access frame typically includes a plurality of bays that partially enclose respective optical fiber multi-service access shelves. Daughter cards and/or modules plugged into respective backplane assemblies coupled to the multi-service access shelves receive signals carried by the optical fiber cables and provide desired interfaces thereto.

Multi-service access frames included in traditional optical fiber administration systems are typically large structures arranged in a number of rows. For example, each multi-service access frame may be mounted between the floor and ceiling of a central office with a few feet separating adjacent rows of frames. The separations between the rows of frames may define either "control aisles" or "maintenance aisles". Each control aisle typically provides access to the multi-service access shelves and the daughter cards and/or modules supported thereon, and each maintenance aisle typically provides access to the respective backplane assemblies and the optical fiber and other cables connected thereto.

One drawback of traditional optical fiber administration systems is that a substantial amount of space is required at a central office to house the rows of multi-service access frames. Further, because the size of the central office typically increases with the space requirements of the multi-service access frames and shelves, the cost of maintaining the central office is also increased. Still further, the substantial space requirements of the multi-service access frames and shelves typically prohibit them from being deployed at smaller locations such as business or residential premises.

It would therefore be desirable to have an improved backplane assembly and shelf arrangement that requires less space than traditional backplane assembly and shelf arrangements. Such improved backplane assembly and shelf arrangements would not only be suitable for use in central telecom offices, but also suitable for use in smaller locations, e.g., business or residential premises.

BRIEF SUMMARY OF THE INVENTION

In accordance with the present invention, an improved backplane and shelf arrangement is provided that includes a backplane assembly and a shelf assembly. The backplane assembly includes a motherboard having a first plurality of connectors for receiving respective daughter cards and/or modules and a second plurality of connectors for receiving signal and/or power cables. Both the first and second pluralities of connectors are mounted on the same side of the motherboard. The shelf assembly includes a housing with opposing sidewalls, a top cover, a bottom support section, and a front cover. The backplane assembly is coupled to the shelf assembly such that the first plurality of connectors is at least partially disposed in the housing of the shelf assembly opposite the front cover, and the second plurality of connectors is external to the shelf housing.

In one embodiment, the backplane and shelf arrangement comprises a backplane assembly including a motherboard and first and second pluralities of connectors mounted on a first surface of the motherboard, and a shelf assembly including a housing, wherein the backplane assembly is coupled to the shelf assembly such that the first plurality of connectors is at least partially disposed in the housing and the second plurality of connectors is external to the housing.

In a preferred embodiment, the second plurality of connectors comprises first and second groups of connectors, and the first plurality of connectors is mounted to the motherboard at a location laterally intermediate the first and second groups of connectors of the second plurality.

Other features, functions, and aspects of the backplane and shelf arrangement will be evident from the Detailed Description of the Invention that follows.

BRIEF DESCRIPTION OF THE SEVERAL VIEWS OF THE DRAWING

The invention will be more fully understood with reference to the following Detailed Description of the Invention in conjunction with the drawings of which.

DETAILED DESCRIPTION OF THE INVENTION

Figure 1A:
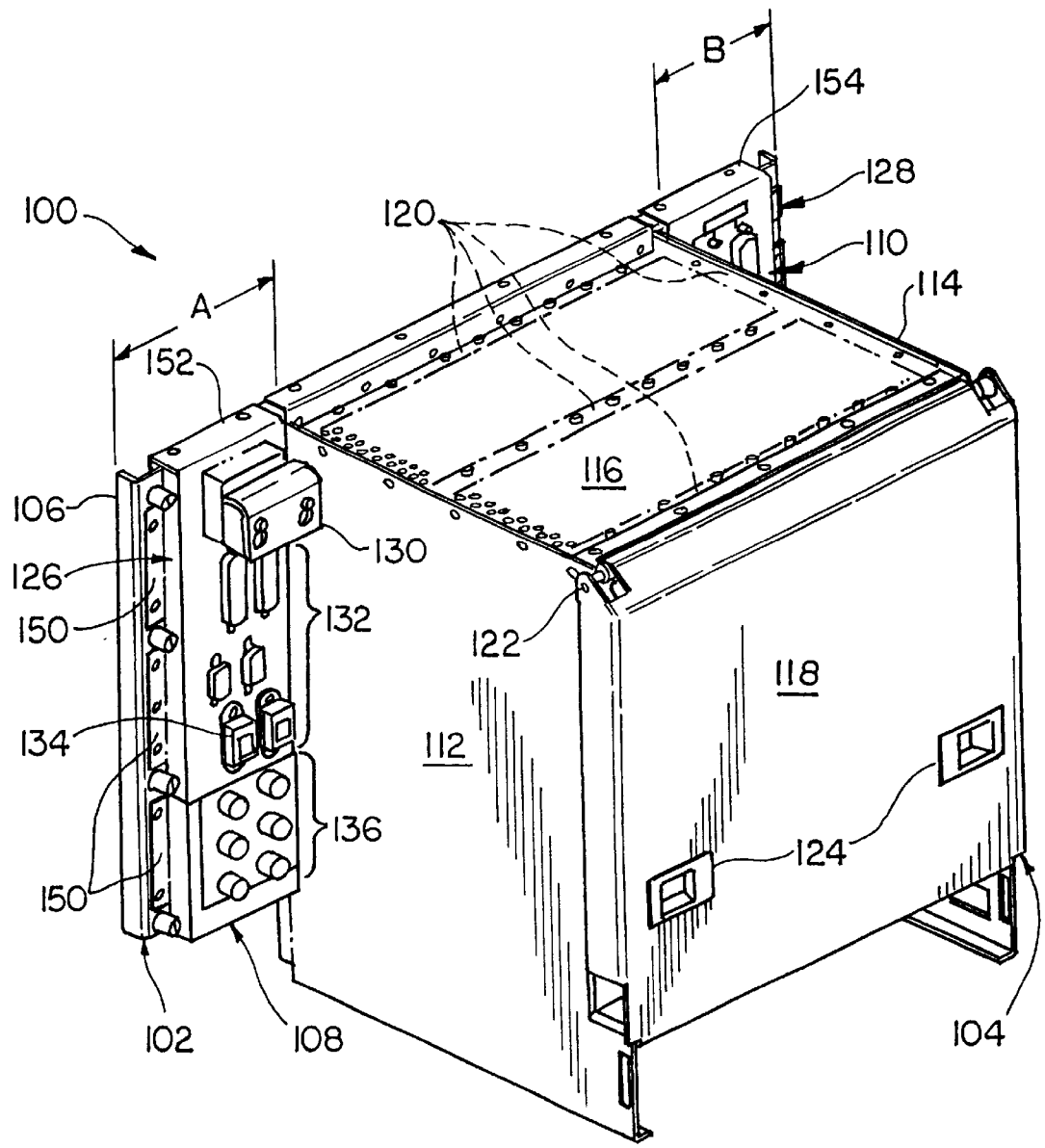
FIG. 1A is a perspective front view of the backplane assembly and shelf arrangement in accordance with the present invention.

FIG. 1A is a perspective front view of an illustrative embodiment of a backplane assembly and shelf arrangement 100 in accordance with the present invention. The backplane and shelf arrangement 100 includes a backplane assembly 102 and a shelf assembly 104 (see also FIG. 1B). Specifically, the backplane assembly 102 comprises a multi-layer printed circuit board 302 ("motherboard"; see FIG. 3) with upper and lower sets of connectors 304 and 306 (see FIG. 3) mounted on a surface thereof for receiving a plurality of printed circuit cards ("daughter cards") and/or modules. It should be understood that the daughter cards and/or modules have connectors mounted thereto that cooperatively mate with the upper and lower connectors 304 and 306 mounted to the motherboard 302. The backplane assembly 102 further comprises a frame member 106 (see also FIG. 3) for supporting the motherboard 302, and the combination of the motherboard 302 and the frame 106 is secured to flanges 402 (see FIG. 4) on the shelf assembly 104 using suitable fasteners such as screws.

Figure 1B:
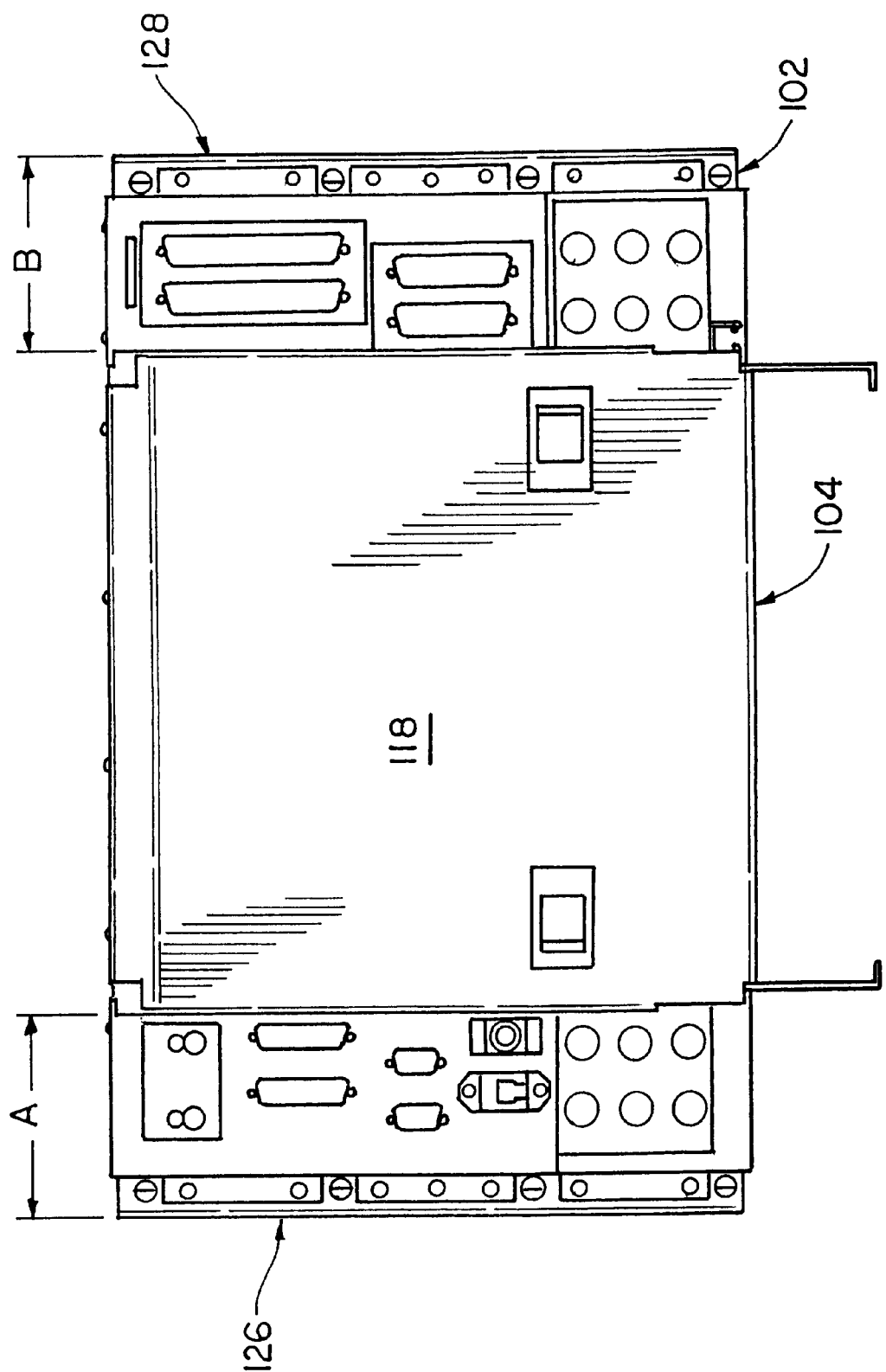
FIG. 1B is a front plan view of the backplane assembly and shelf arrangement of FIG. 1.

The shelf assembly 104 comprises a housing with generally planar sidewalls 112 and 114, a top cover 116, and a front cover 118 (see also FIG. 1B). In the illustrated embodiment, the sidewalls 112 and 114, and the top cover 116, are fabricated from respective sheets of metal and are secured to support brackets, e.g., support brackets 120 (as depicted in phantom in FIG. 1A), by suitable fasteners, e.g., screws and/or rivets. The front cover 118 is also fabricated from sheet metal and is secured at respective opposing corners 404 (see FIG. 4) of the sidewalls 112 and 114 by a pivot pin 122. In this illustrative embodiment, the pivot pin 122 extends substantially across the width of the front cover 118 and is seated in notches 405 (see FIG. 4) formed at the opposing corners 404. Further, the opposing corners 404 are beveled to allow the front cover 118 to rotate freely up and away from the sidewalls 112 and 114 about the pivot pin 122 to provide front access to the upper and lower connectors 304 and 306 of the backplane assembly 102 and any daughter cards and/or modules connected thereto. Conventional spring-biased latches 124 are used to secure the front cover 118 to the sidewalls 112 and 114 when the front cover 118 is in a closed position.

The shelf assembly 104 facilitates the insertion and retraction of the plurality of daughter cards and/or modules into and out of the upper and lower connectors 304 and 306 mounted on the surface of the motherboard 302 of the backplane assembly 102. Specifically, a plurality of planar members such as a planar member 410 (see FIG. 4) is coupled between the top cover 116 and a plurality of elongated support sections such as an elongated support section 406 (see FIG. 4). The sidewalls 112 and 114, the top cover 116, the elongated support sections 406, and the planar members 410 cooperate to define a plurality of slots such as a slot 408 for receiving the daughter cards and/or modules. For example, each of the elongated support sections 406 may have a lower guide channel protruding from a surface thereof and extending the substantial length of the support section 406 for slidably receiving a lower edge of a daughter card, and the top cover 116 may have a plurality of corresponding upper guide channels protruding therefrom for slidably receiving upper edges of respective daughter cards. Both the upper and lower guide channels receive the upper and lower edges, respectively, of the daughter cards so that the daughter cards are in proper registration with the upper and lower connectors 304 and 306 of the backplane assembly 102. As a result, respective daughter cards may be slidably received in the slots 408 and subsequently inserted (retracted) into (out of) the upper and lower connectors 304 and 306 mounted to the motherboard 302.

As mentioned above, the combination of the motherboard 302 and the frame 106 is secured to the flanges 402 on the shelf assembly 104 by suitable fasteners. In a preferred embodiment, the frame 106 includes a pair of intermediate vertical members 308 (see FIG. 3), and the combination of the motherboard 302 and the frame 106 is secured to the flanges 402 on the sidewalls 112 and 114 at the intermediate vertical members 308. As a result, one pair of upper and lower connectors 304 and 306 is in registration with and at least partially disposed in each of the slots 408 of the shelf assembly 104, and rectangular sections 126 and 128 (see FIGS. 1A and 1B) of the backplane assembly 102 extend beyond the respective sidewalls 112 and 114 of the shelf assembly 104.

The frame 106 further includes upper and lower horizontal members 314 and 316 (see FIG. 3), and the combination of the motherboard 302 and the frame 106 is further secured to a flange 417 (see FIG. 4) on the top cover 116 at the upper horizontal member 314 and an elongated plate 430 of the shelf assembly 104 at the lower horizontal member 316 by suitable fasteners, e.g., screws. A first pair of guide pins 434 are provided at opposite ends of the plate 430; and, a second pair of guide pins 435 are provided on the flanges 402 of the sidewalls 112 and 114, respectively. The pairs of guide pins 434 and 435 pass through corresponding holes in the motherboard 302 and the lower horizontal member 316 to facilitate the alignment of the backplane assembly 102 with the shelf assembly 104.

In the illustrated embodiment, the rectangular section 126 extends beyond the sidewall 112 by a distance "A", and the rectangular section 128 extends beyond the sidewall 114 by a distance "B", as indicated in FIGS. 1A and 1B. However, it should be noted that in alternative embodiments of the backplane assembly and shelf arrangement 100, a rectangular section at only one end of the backplane assembly 102, e.g., either the section 126 or the section 128, may extend beyond the confines of the shelf assembly 104. Further, in those embodiments wherein both of the rectangular sections 126 and 128 of the backplane assembly 102 extend beyond the confines of the shelf assembly 104, the distance "A" may be equal to or different from the distance "B". Still further, it should be understood that the sections 126 and 128 extending beyond the sidewalls 112 and 114, respectively, of the shelf assembly 104 need not be rectangular but may have any suitable shape. Yet further, it is noted that suitably shaped sections of the backplane assembly 102 may extend beyond the top cover 116 and/or the elongated plate 430 at the bottom of the shelf assembly 104.

In the illustrated embodiment, the rectangular sections 126 and 128 of the backplane assembly 102 extending beyond the confines of the shelf assembly 104 each include a plurality of terminals and/or connectors for coupling to signal and/or power cables. Specifically, the section 126 of the backplane assembly 102 extending beyond the sidewall 112 includes a terminal block assembly 130; a plurality of DIN-style connectors 132 for handling signals related to, e.g., alarm and diagnostic functions; an RJ10-style connector 134 for connecting to a modem cable; and, a first plurality of DS3 connectors 136. Further, the section 128 extending beyond the sidewall 114 includes a plurality of DS1 connectors 340 (see FIG. 3) and a second plurality of DS3 connectors 342 (see FIG. 3).

Figure 3:
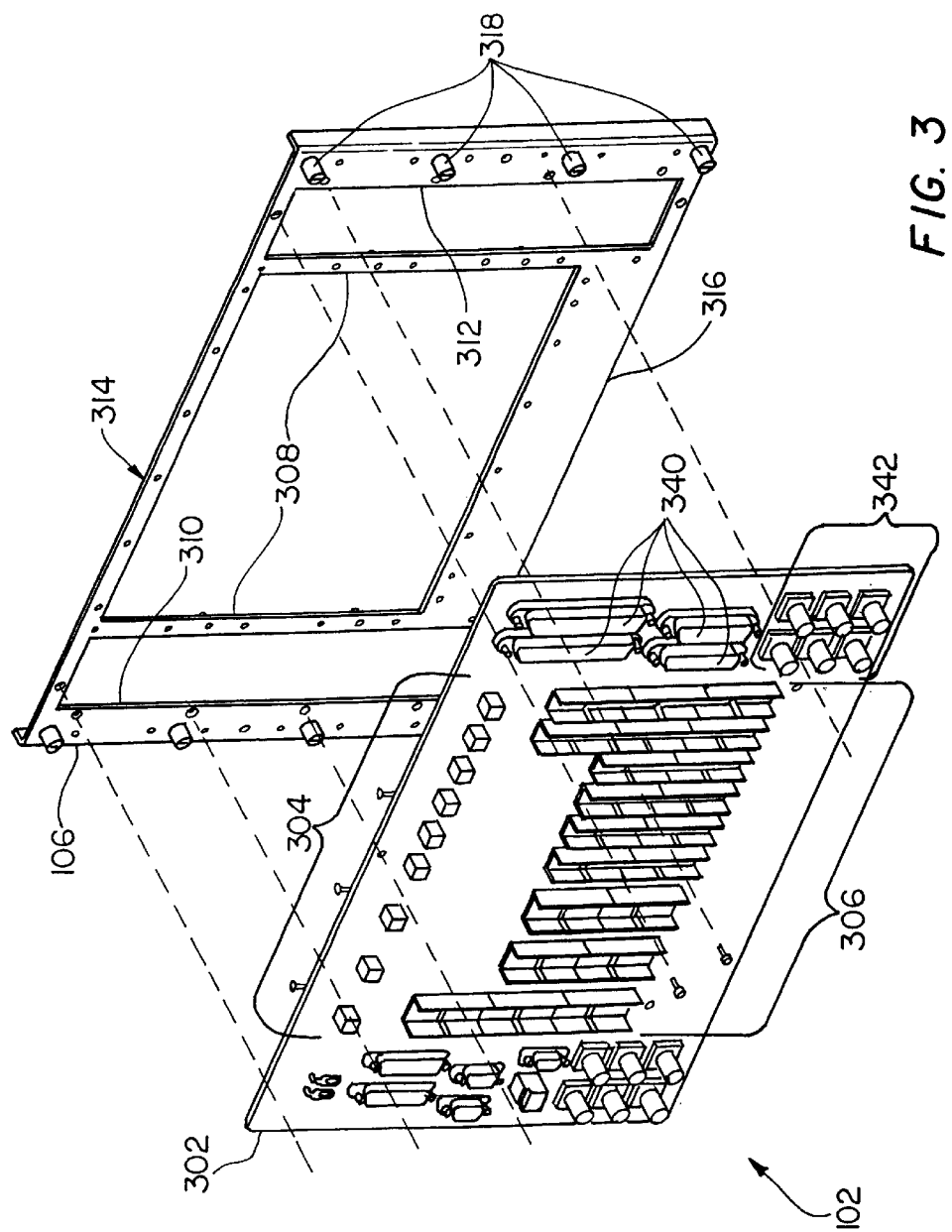
FIG. 3 is a partially exploded, perspective front view of the backplane assembly included in the backplane assembly and shelf arrangement of FIG. 1.
Figure 4:
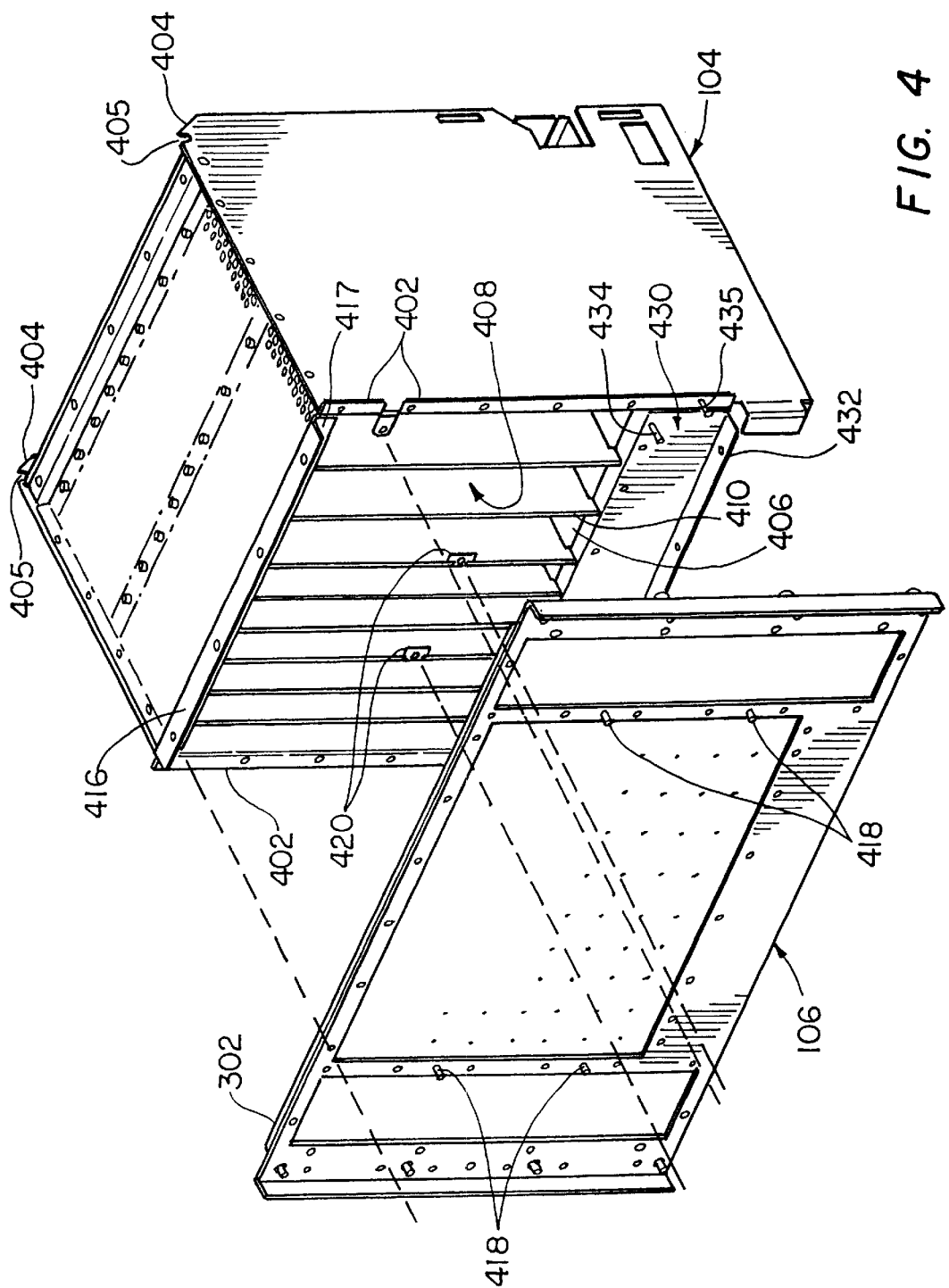
FIG. 4 is a partially exploded, perspective rear view of the backplane assembly and shelf arrangement of FIG. 1.

Although particular configurations of terminals and connectors are mounted at the extending rectangular sections 126 and 128 of the backplane assembly 102, as depicted in FIGS. 1A, 1B, and 3, it should be noted that any type of terminals and/or connectors may be so mounted to these sections 126 and 128. In this exemplary embodiment, the backplane assembly and shelf arrangement 100 may be a multi-service access backplane and shelf arrangement included in an optical fiber administration system. The terminal block assembly 130 and the connectors 132, 134, 136, 340, and 342 mounted at the extending rectangular sections 126 and 128 of the backplane assembly 102 may therefore be specifically adapted to that application.

The backplane assembly 102 includes front covers 108 and 110 (see FIG. 1A) that at least partially enclose the terminals and/or connectors mounted at the extending sections 126 and 128, respectively, of the backplane assembly 102. Specifically, flanges 150 on the front cover 108 are secured to a vertical support member 310 (see FIG. 3) of the frame 106 by suitable fasteners. Flanges (not shown) on the front cover 110 are similarly secured to another vertical support member 312 (see FIG. 3) of the frame 106.

Figure 2:
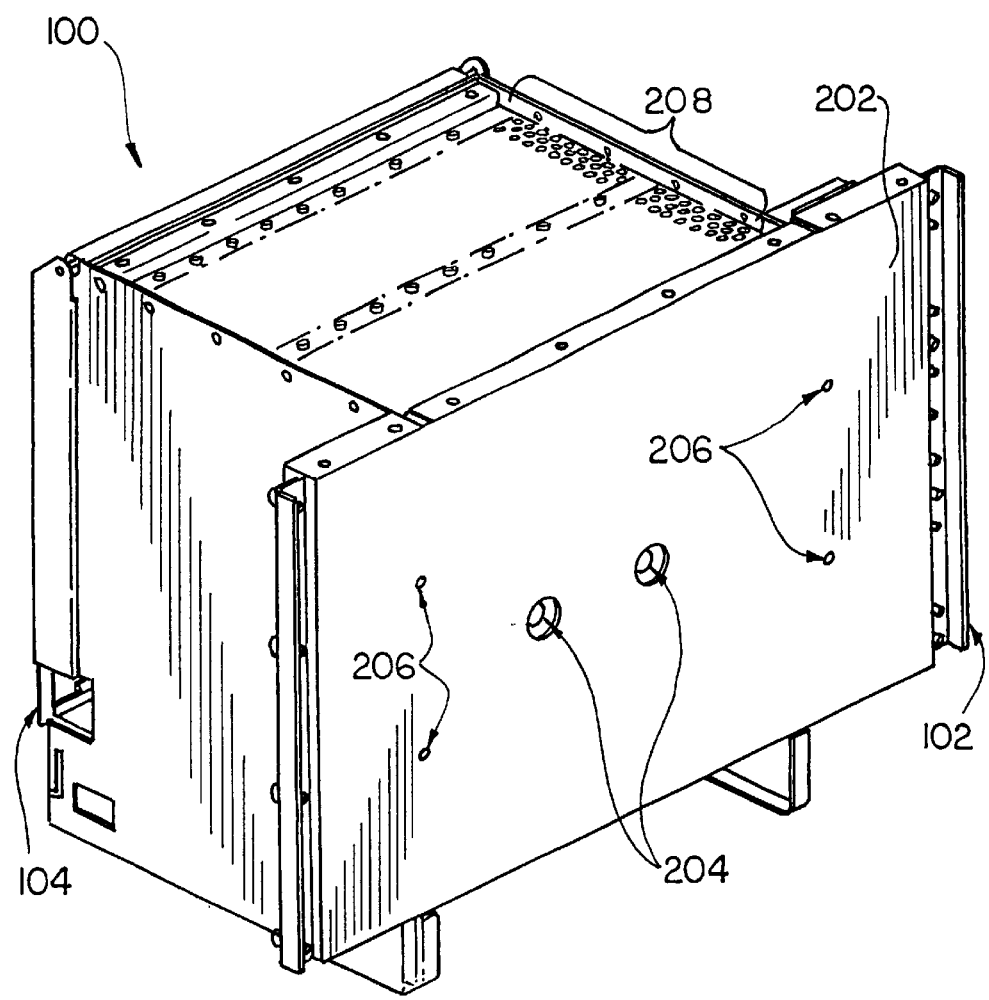
FIG. 2 is a perspective rear view of the backplane assembly and shelf arrangement of FIG. 1.

The backplane assembly 102 further includes a rear cover 202 (see FIG. 2) that substantially encloses the frame 106 and the backside of the motherboard 302. Specifically, the rear cover 202 is secured to the frame 106 by suitable fasteners such as screws or rivets passing through recessed holes 206 in the rear cover 202 for engaging respective standoffs 418 (see FIG. 4) mounted to the intermediate vertical members 308, and passing through recessed holes 204 and standoffs (not shown) for engaging respective mounting tabs 420 (see FIG. 4) on the shelf assembly 104. Flanges 152 and 154 (see FIG. 1A) on the front covers 108 and 110, respectively; a flange 416 (see FIG. 4) on the top cover 116; and, a flange 432 (see FIG. 4) on the plate 430 are also secured to the rear cover 202 by suitable fasteners.

Moreover, a plurality of holes 208 (see FIG. 2) is provided through the top cover 116 adjacent the sidewall 112. The plurality of holes 208, and spaces between the planar members 410, the support sections 406, and the front cover 118 cooperate to facilitate airflow through the housing of the shelf assembly 104 to provide convective cooling of the backplane assembly and shelf arrangement 100.

It is noted that the shelf assembly 104, the daughter cards and/or modules (not shown) supported by the shelf assembly 104, the extending rectangular sections 126 and 128 of the backplane assembly 102, and the terminals and connectors 130, 132, 134, 136, 340, and 342 mounted at the sections 126 and 128 of the backplane assembly 102, are all accessed from the same side, i.e., the front side, of the backplane assembly and shelf arrangement 100. This means that the backplane assembly and shelf arrangement 100 may be housed in an enclosure such as a wall-mounted enclosure that provides access to only the front side of the backplane assembly and shelf arrangement 100. It should be understood, however, that the backplane assembly and shelf arrangement 100 may alternatively be housed in a traditional frame or rack-mounted enclosure. In this illustrative embodiment, suitable fasteners, e.g., screws 318, are provided at the vertical support members 310 and 312 to couple the backplane assembly and shelf arrangement 100 to a wall- or rack-mounted enclosure.

Those of ordinary skill in the art should further appreciate that variations to and modification of the above-described backplane and shelf arrangement may be made without departing from the inventive concepts disclosed herein. Accordingly, the present invention should be viewed as limited solely by the scope and spirit of the appended claims.

What is claimed is:

1. An electronic chassis, comprising:

a backplane assembly including a motherboard and first and second pluralities of connectors, the motherboard having a first side and a second side opposite the first side, the first and second pluralities of connectors being accessible from the first side of the motherboard, the backplane assembly including no connectors accessible from the second side of the motherboard; and a shelf assembly including a housing, wherein the backplane assembly is coupled to the shelf assembly such that the first plurality of connectors is at least partially disposed in the housing and the second plurality of connectors is external to the housing.

2. The electronic chassis of claim 1 wherein the shelf assembly is configured to support at least one daughter card, and the first plurality of connectors is operative to receive the at least one daughter card supported by the shelf assembly.

3. The electronic chassis of claim 1 wherein the second plurality of connectors is operative to receive at least one of a signal cable and a power cable.

4. The electronic chassis of claim 1 wherein the housing of the shelf assembly comprises opposing first and second sidewalls, and the backplane assembly is coupled to the shelf assembly such that at least one section of the first side of the motherboard having at least a portion of the second plurality of connectors mounted thereon extends beyond at least one of the opposing first and second sidewalls.

5. The electronic chassis of claim 1 wherein the housing of the shelf assembly comprises an upper planar section and at least one lower support section, and the backplane assembly is coupled to the shelf assembly such that at least one section of the first side of the motherboard having at least a portion of the second plurality of connectors mounted thereon extends beyond at least one of the upper planar section and the lower support section.

6. The electronic chassis of claim 1 wherein the housing of the shelf assembly comprises a pair of opposing sidewalls and a front cover pivotally coupled to the pair of sidewalls.

7. The electronic chassis of claim 1 wherein the backplane assembly further includes a cover substantially enclosing the second side of the motherboard.

8. The electronic chassis of claim 1 wherein the second plurality of connectors comprises first and second groups of connectors and the first plurality of connectors is mounted on the first side of the motherboard at a location laterally intermediate the first and second groups of connectors of the second plurality.

* * * * *

UNITED STATES PATENT AND TRADEMARK OFFICE
CERTIFICATE OF CORRECTION

PATENT NO. : 6,510,055 B1
DATED : January 21, 2003
INVENTOR(S) : Kan S. Liu et al.

It is certified that error appears in the above-identified patent and that said Letters Patent is hereby corrected as shown below:

<u>Title page,</u>
Item [75], Inventors, "New York, NY" should read -- Flower Hill, NY --.

Signed and Sealed this

Thirteenth Day of April, 2004

JON W. DUDAS
*Acting Director of the United States Patent and Trademark Office*